United States Patent [19]

Hughes

[11] Patent Number: 4,831,329
[45] Date of Patent: May 16, 1989

[54] METHOD AND APPARATUS TO CORRECT FOR A PHASE ERROR IN CENTRAL SECTION MAGNETIC RESONANCE IMAGING DATA

[75] Inventor: Simon H. C. Hughes, Gurnee, Ill.

[73] Assignee: Kabushiki Kaisha Toshiba, Kanagawa, Japan

[21] Appl. No.: 141,919

[22] Filed: Jan. 11, 1988

[51] Int. Cl.$^4$ ............................................. G01R 33/20
[52] U.S. Cl. ...................................... 324/309; 324/312
[58] Field of Search ................ 324/309, 312; 364/313, 364/314

[56] References Cited

U.S. PATENT DOCUMENTS

| | | | |
|---|---|---|---|
| 4,706,027 | 11/1987 | Hughes | 324/309 |
| 4,736,160 | 4/1988 | Sano et al. | 324/312 |
| 4,745,364 | 5/1988 | Hatanaka | 324/309 |

Primary Examiner—Tom Noland
Assistant Examiner—Lawrence G. Fess
Attorney, Agent, or Firm—Finnegan, Henderson, Farabow, Garrett, & Dunner

[57] ABSTRACT

A method and related apparatus are provided for correcting for a phase error in MRI observed values which represent a scan line which passes through the origin of Fourier space. The phase error is estimated by calculating the phase of the sum of the observed values. The observed values are then modified as a function of the estimated phase error. To minimize the effect of $T_2$ decay, the phase error may be estimated by calculating the phase of the sum of the product of each pair of observed values on the scan line which have been relocated symmetrically, one on each side of the Fourier space origin.

26 Claims, 4 Drawing Sheets

METHOD AND APPARATUS TO CORRECT FOR A PHASE ERROR IN CENTRAL SECTION MAGNETIC RESONANCE IMAGING DATA

BACKGROUND OF THE INVENTION

I. Field of the Invention

The present invention relates to Magnetic Resonance Imaging (MRI) and more particularly to methods and related apparatus for removing a phase error in digitized MRI data resulting from, inter alia, quadrature demodulation of an MRI echo signal from an observed object.

II. Background Information

A Two Dimensional Fourier Transform (2DFT) MRI system such as that discussed by A. Kumar, et al. in J. Magn. Reson. 18: 69–83, 1975, subjects an object, such as a human body, to a series of magnetic fields and radio frequency (RF) pulses. The RF pulses resonate selected atomic nuclei in the object as a consequence of the characteristics of the atoms, the applied magnetic fields, and the RF pulses. The resonant nuclei precess in the magnetic fields and radiate a detectable RF echo signal containing information about the location of the radiating atoms. As is well known to those skilled in the art, the echo, when quadrature demodulated by a reference waveform, is a sample of the two dimensional Fourier transform, designated F(X,Y), of the object density per unit area, designated f(x,y), of the selected nuclei in a slice plane through the object defined by the magnetic field gradients. The object density function f(x,y) represents the spatial distribution of the resonant atoms and their relaxation times in the object, and is used to construct a visual image of some property of the object along the slice plane or volume. The object density function is a function of the spin density $\rho$, spin lattice relaxation time $T_1$, and the spin-spin relaxation time $T_2$ at each point x,y in real space on a plane passing through the object under observation. Because of unknown and time varying differences between the phase of the echo signal from the object and the quadrature demodulation reference waveform, the demodulation process used in the collection of complex data from a phase sensitive detector system introduces a phase error into the MRI data that distorts the final visual image.

If the object under observation is a human body, then the spatial coordinates x, y, and z may be oriented with respect to the body as shown in FIG. 1. By subjecting the object to a static magnetic field, usually parallel to the Z axis, and gradient magnetic fields, data values represented by the function F(X,Y) can be collected along specific paths on the Fourier space plane defined by:

$$X(t) = \frac{\gamma}{2\pi} \int_0^t g_x(\tau) d\tau$$

$$Y(t) = \frac{\gamma}{2\pi} \int_0^t g_y(\tau) d\tau$$

The function $g_x$ is the "read" magnetic field gradient with a gradient direction parallel to the x-axis, $g_y$ is the "encode" magnetic field gradient with a gradient parallel to the y-axis, and $\gamma$ is the magnetogyric ratio of the atoms under observation. Selection of the static and gradient fields defines the location and orientation of the Fourier space coordinates.

One proposed error correction method, described in U.S. Pat. No. 4,706,027, incorporated herein by reference, estimates and corrects the phase error occurring in scan lines which do not pass through the origin of Fourier space. That technique requires an estimate of the phase error in F(X,Y) at the origin of Fourier space, F(0,0), based on the theorem that the Fourier transform F(0,0) is real at the origin because f(0,0) is real. Any complex components of f(0,0) must therefore be the result of a phase error such as that introduced by the quadrature demodulation process. For the theorem to be applied, the value of the one data value at the origin in Fourier space must be known. To find the data value at the origin, a scan line is generated that passes through the origin. The data values comprising any scan line through the origin are called central section data values, and the scan line is called a central section scan line.

In existing MRI scanners, the phase error is calculated based on a zero location and correction calculation which estimates the location of the peak value of $|F(X,Y)|$ which is assumed to be the value at the origin of Fourier space. Often the peak falls at some location between two data values, as shown in FIG. 4, therefore the location of the peak must be interpolated. The estimate of the phase error therefore depends on an interpolation calculated from three observed data values, each of which is subject to experimental error. Because of noise in the received signals, the calculated value of F(0,0) is not guaranteed to be the actual value at the origin, resulting in additional errors in the phase error calculation.

Another source of errors in the phase error calculation is the decay of the magnitude of RF echo signals, indicated by $T_2$. The $T_2$ decay results from slightly different precession rates of the resonant atomic nuclei in the object which are subject to inhomogeneous magnetic fields from the MRI system magnets and from other molecules.

SUMMARY OF THE INVENTION

It is therefore an object of the present invention to provide an improved method to calculate the phase error arising from the collection of data values from phase sensitive detector systems.

It is an additional object of the present invention to provide a more accurate phase error estimate based on observed values of central section data values.

Another object is to provide a phase error calculation when the effect of a $T_2$ decay is not negligible.

Additional objects and advantages of the invention will be set forth in the description which follows, and in part will be obvious from the description, or may be learned by practice of the invention.

To achieve the foregoing objects and in accordance with the purposes of the invention as embodied and broadly described herein, a method and related apparatus is provided for correcting for a phase error in central section magnetic resonance imaging data values obtained from an object under observation comprising the steps of subjecting the object to magnetic field gradients and radio frequency pulses to produce from the object a plurality of observed values, $\mathring{F}_j$, of the central section data values representing a central section scan line in a Fourier space defined by the magnetic field gradients; estimating the phase error of the observed values by calculating the phase of the sum of the observed values; and modifying the observed values as a function of the estimated phase error to obtain an estimate $\hat{F}_j$ of the central section data values having a substantially reduced phase error.

Further in accordance with the invention, a method and related apparatus is provided for correcting for a phase error in central section magnetic resonance imaging data obtained from an object under observation comprising the steps of subjecting the object to magnetic field gradients and radio frequency pulses to produce from the object a plurality of observed values, $\mathring{F}_j$, of the central section data values representing a central section scan line in a Fourier space defined by the magnetic field gradients; performing a zero location and correction of the observed values to situate the observed values in pairs symmetrically located one on either side of the origin of the Fourier space; estimating the phase error of the observed values by calculating the phase of the sum S of the product of each of the pairs of observed values; and modifying the observed values as a function of the estimated phase error to obtain an estimate $\hat{F}_j$ of the central section data values having a substantially reduced phase error.

The accompanying drawings, which are incorporated in and constitute a part of the specification, illustrate preferred embodiments of the invention and, together with the general description given above and the detailed description of the preferred embodiments given below, serve to explain the principles of the invention.

DESCRIPTION OF THE PREFERRED EMBODIMENT

Reference will now be made in detail to the present preferred embodiments of the invention as illustrated in the accompanying drawings.

TABLE 1

NOTATION CONVENTIONS f( ) = a function;
F( ) = the Fourier transform of f;
$\bar{F}$ = the complex conjugate of F;
$\mathring{f}$( ) = an observed value of f subject to phase error;
$\mathring{F}$( ) = an observed value of F subject to phase error;
$\hat{f}$( ) = an estimate of f made from $\mathring{f}$ and corrected for phase error;
$\hat{F}$( ) = an estimate of F made from $\mathring{F}$ and corrected for phase error;
$\phi$ = an actual phase error angle;

$\hat{\phi}$ = an estimated phase error angle;
$[e^{i\phi}]$ = an actual phase error term;
$[e^{i\hat{\phi}}]$ = an estimated phase error term;
$[e^{-i\hat{\phi}}]$ = an estimated phase error correction term;
$e^{-i\hat{\phi}}$ = an estimated phase error correction term based on an estimated phase error angle.

Figure 1:
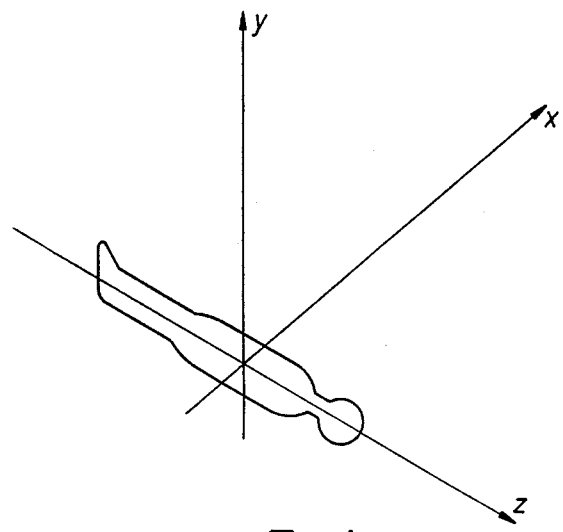
FIG. 1 is a diagram of an object oriented within a three dimensional orthogonal spatial coordinate system.
Figure 2:
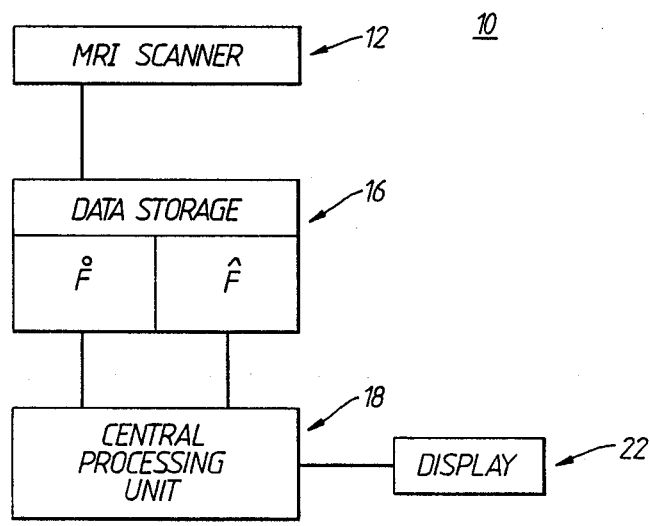
FIG. 2 is a block diagram of an MRI apparatus which may be used to correct for a phase error in accordance with the teachings of the present invention.

An MRI device 10 is shown in block diagram form in FIG. 2 as comprising MRI scanner 12, data storage device 16, central processing unit 18, and display device 22. MRI device 10 may scan an object such as a human body by subjecting it to magnetic field gradients and radio frequency (RF) pulses to provide imaging data values, including observed values uncorrected for gain and offset, along a central section scan line, i.e., a scan line passing through the origin of a Fourier space defined by the magnetic field gradients and RF pulses. The uncorrected observed values consist of the Fourier transform of samples of a series of RF echoes from the object and are representative of a property of the object on a path along the central section scan line. The data values, including the uncorrected observed values, are corrected for gain and offset in a conventional manner to become corrected observed values, or just observed values, and are passed to storage device 16, and central processor 18. Central processor 18 executes the computational steps of either the first or second preferred embodiment, shown by the flowcharts in FIGS. 3 and 5, respectively, on the observed values to perform the phase error correction methods of the present invention. The observed values may then be processed by central processor 18, with the benefit of the resultant phase error correction of the present invention, for display of a visual image on display 22.

The method of the first preferred embodiment assumes that $T_2$ decay is negligible over the time interval during which the observed values are collected. For MRI data based on echo signals from hydrogen nuclei, $T_2$ is roughly 5-10 msec.; therefore, if data collection occurs over a 1 msec. or shorter time interval, this assumption is valid. If the time interval is longer than about 1 msec., this assumption may not be valid and the $T_2$ effect must be considered. The method of the second preferred embodiment, discussed below, may be used to correct for the $T_2$ effect. The method of the second preferred embodiment requires that the observed values be symmetrically located in pairs, with each member of a pair located one on either side of the origin. This can be accomplished by a conventional zero location and correction calculation.

Figure 3:
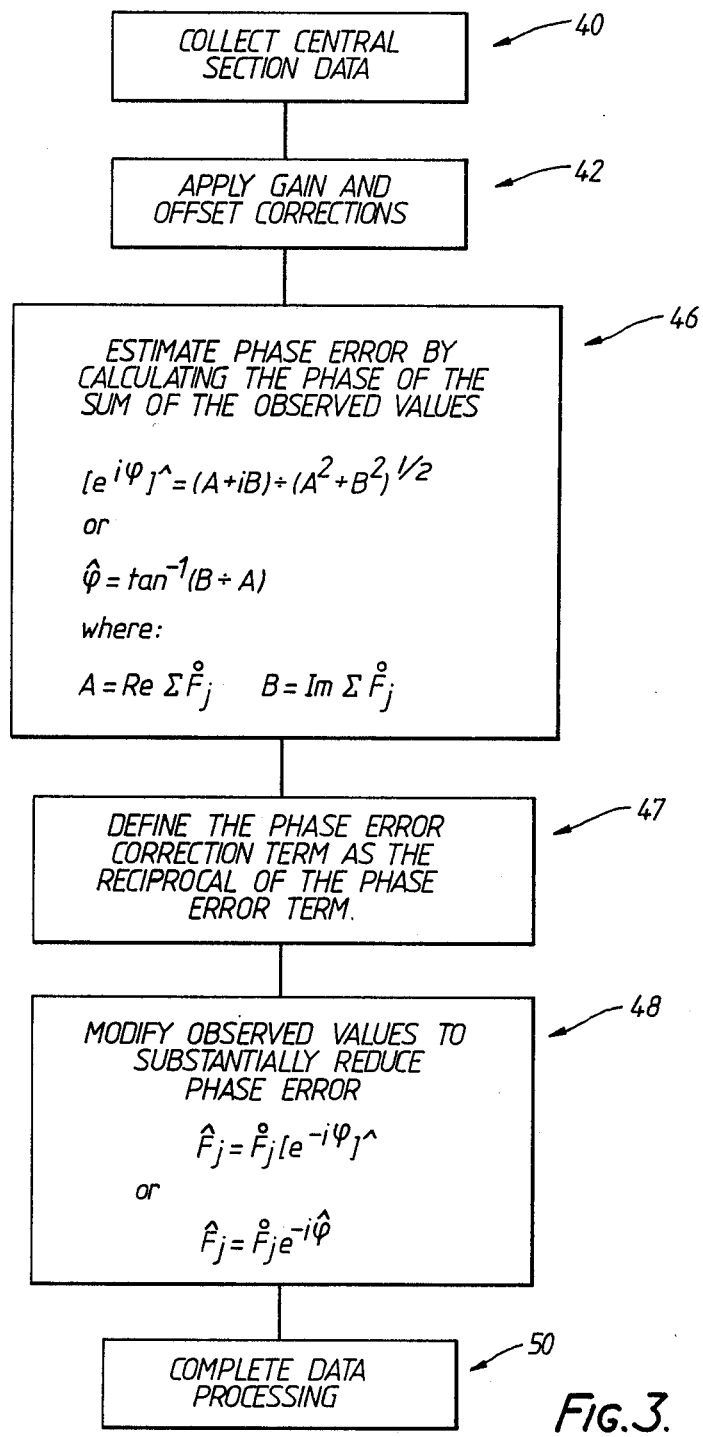
FIG. 3 is a flow diagram of the functions performed by the MRI apparatus of FIG. 2 to calculate a phase error according to a first preferred embodiment of the invention.
Figure 4:
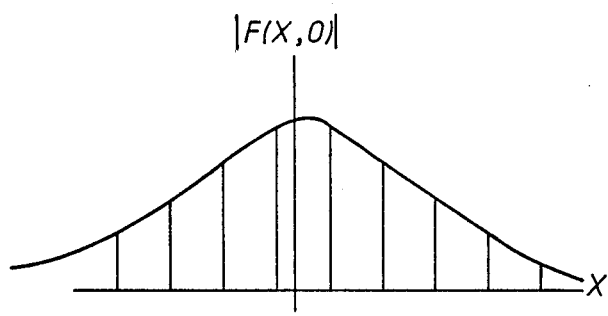
FIG. 4 is a plot of the magnitude of F(X,0) along the X axis in Fourier space.

In the first preferred embodiment, as shown in the flow chart of FIG. 3, the central section MRI uncorrected observed values are collected from the object, step 40; gain and offset corrections are applied, step 42; the phase error is estimated from the phase of the sum of the observed values, step 46; a phase error correction term is defined as the reciprocal of the phase error term, step 47; the observed values are modified to substantially reduce phase error, step 48; and the modified observed values are used for other processing purposes such as correcting data values for other scan lines, or otherwise contributing to the production of a visual display, step 50.

For clarity of discussion, continuous functions at times will be used to represent the MRI data; however, the actual data stored and processed by device 10 of FIG. 2 preferably consist of discrete samples of the continuous functions described herein, i.e., data values. Discrete approximations to the continuous functions will be presented where appropriate. The terms "data values" and "observed values" may be interchanged.

The step 40 collection of uncorrected observed values may be accomplished using MRI scanner 12 of FIG. 2, as described above. As is well known to those skilled in the art, scanner 12 may be used to collect RF echoes and generate observed values along a central section scan line. A central section scan line of F(X,Y) is defined as a set of values of F that lie along a straight line passing through the origin of Fourier space. The observed values used for the first and second preferred embodiments preferably lie along the X axis; however, data values representing any line passing through the origin of the resultant Fourier space may be used according to the teachings of the present invention. With the observed values of the preferred embodiments constrained to lie along the X axis, Y is equal to 0 in the subsequent calculations. By suitable choice of magnetic fields, X can be made a linear function of t:

$$X(t) = \alpha t + \beta.$$

In this case the observable signal is F(X(t),0) and the signal is sampled at discrete times $t = j \Delta t$. The data collected are therefore observations, $\overset{\circ}{F}_j$, of the values:

$$\overset{\circ}{F}_j = F(X(\alpha j \Delta t + \beta), 0).$$

One or more RF echo signals may be combined to construct the observed values, the advantage being that the greater the number of RF echoes combined to generate the observed values, the more the random noise errors are averaged over a large number of readings, and the more accurate the resulting phase error estimate.

Data offset and gain corrections, step 42 of FIG. 3, are performed in a conventional manner by first calculating the gain and offset correction factors based on reference signals, and later applying the correction factors to the uncorrected observed values to obtain corrected observed values, also called observed values. This corrects for errors resulting from multiple channel data amplifier gain and bias differences in scanner 12 of device 10, and will also correct for any other effects which result in additional offset gain and offset errors.

In accordance with the invention, the phase error of the observed values is estimated by calculating the phase of the sum of the observed values. As will be explained in more detail below, this estimate of phase error may be expressed as an estimated phase error term $[e^{i\hat{\phi}}]$ which can be calculated directly from the sum of the observed values as shown by step 46 of FIG. 3. In the alternative, the estimate of phase error may be expressed as an estimated phase error angle $\hat{\phi}$, which can also be calculated directly from the sum. This phase error angle can then be used to calculate an estimated phase error term $e^{i\hat{\phi}}$. In either event, the estimated phase error correction term is defined to be the reciprocal of the estimated phase error term and has one of the values:

$$\frac{1}{[e^{i\hat{\phi}}]} \text{ or } e^{-i\hat{\phi}}, \text{ respectively.}$$

With regard to step 46 of FIG. 3, if the Fourier transform operator of the observed values is denoted by $F_x$, then:

$$F_x\{h(x)\} = H(X) = \int_{-\infty}^{+\infty} h(x) e^{-2\pi i x X} dx \quad (1)$$

for some arbitrary function h(x). The Fourier operator $F_y$ is defined in a similar manner. The object density function is defined as f(x,y) and is related to scan data F(X,Y) measured during an MRI scan by:

$$F(X,Y) = F_x F_y \{f(x,y)\} \quad (2)$$

F is typically sampled at $\Delta t$ intervals along points (X,Y) lying on a straight line in Fourier space. The object density function f(x,y) is a function of the spin density $\rho$, spin lattice relaxation time $T_1$, and the spin-spin relaxation time $T_2$, at each point x,y in physical space on a plane passing through the object under observation.

If the phase error angle in the central section data F is represented by $\phi$, then the observed values $\overset{\circ}{F}$ will be related to the ideal error free data by:

$$\overset{\circ}{F}(X,0) = e^{i\phi} F(X,0) \quad (3)$$

If $F_x^{-1}$ is the inverse Fourier transform with respect to x, then a function P(x,Y) is defined as:

$$F_x^{-1}\{F(X,Y)\} \equiv P(x,Y) \equiv F_y\{f(x,y)\}. \quad (4)$$

It follows from standard Fourier transform theory and from the definition of P(x,Y):

$$\int_{-\infty}^{+\infty} F(X,0) \, dX = \int_{-\infty}^{+\infty} F(X,Y) e^{2\pi i x X} \, dX \Big|_{x=0, Y=0} \quad (5)$$

$$= P(x,Y) \Big|_{x=0, Y=0} \quad (6)$$

$$= \int_{-\infty}^{+\infty} f(x,y) e^{2\pi i y Y} \, dy \Big|_{x=0, Y=0} \quad (7)$$

$$= \int_{-\infty}^{+\infty} f(0,y) \, dy \quad (8)$$

and

-continued $$\int_{-\infty}^{+\infty} \overset{\circ}{F}(X,0) \, dX = \int_{-\infty}^{+\infty} e^{i\phi} F(X,0) \, dX \quad (9)$$

$$= e^{i\phi} \int_{-\infty}^{+\infty} f(0,y) \, dy. \quad (10)$$

Equations (9) and (10) imply that since f(x,y) is real, any non-zero phase in the expression $$\int_{-\infty}^{+\infty} \overset{\circ}{F}(X,0) \, dX \quad (11)$$

is the result of the phase error term, $e^{i\phi}$, and this quantity can therefore be estimated by the phase term of the integral of the observed values.

In practice, the values of discrete samples of continuous funtions are summed in lieu of calculating integrals of continuous functions. The phase error term $e^{i\phi}$ is therefore estimated by the phase term of a sum of the observed values.

The integral of the observable data:

$$\int_{-\infty}^{+\infty} \overset{\circ}{F}(X,0) \, dX = \int_{-\infty}^{+\infty} e^{i\phi} F(\alpha t + \beta, 0) \, \alpha \, dt$$

is independent of $\beta$. Thus the sum:

$$\Sigma \overset{\circ}{F}_j = \Sigma e^{i\phi} F_j = \Sigma e^{i\phi} F(\alpha j \Delta t + \beta, 0)$$

is also approximately independent of $\beta$ and it is therefore unnecessary to locate any of the sample points $X_j = \alpha j \Delta t + \beta$ at any absolute point relative to the origin.

If the sampled data, corrected for gain and offset errors, are represented by:

$$\overset{\circ}{F}_j = Re \, \overset{\circ}{F}_j + i \, Im \, \overset{\circ}{F}_j = Re \, \overset{\circ}{F}(X_j,0) + i \, Im \, \overset{\circ}{F}(X_j,0) \quad (12)$$

where Re and Im refer to the real and imaginary parts of $F_j$, and:

$$X_j = \alpha j \Delta t + \beta,$$

then the phase error term $e^{i\phi}$ for the sum of the observed values can be estimated by $[e^{i\phi}]^{\hat{}}$, where:

$$[e^{i\phi}]^{\hat{}} = \left[ Re \sum_j \overset{\circ}{F}_j + i \, Im \sum_j \overset{\circ}{F}_j \right] \div | \Sigma \overset{\circ}{F}_j | \quad (13)$$

and where $$| \Sigma \overset{\circ}{F}_j | = \{ Re(\Sigma \overset{\circ}{F}_j)^2 + i \, Im(\Sigma \overset{\circ}{F}_j)^2 \}^{\frac{1}{2}} \quad (14)$$

and j runs over each of the observed values in the central section echo. To calculate the phase term of the sum of the observed values, central processing unit 18 of MRI device 10 computes the following sums of the gain and offset corrected observed values for one or more echoes along a central section scan line, step 46 of FIG. 3:

$$A = Re \Sigma \overset{\circ}{F}_j$$

$$B = Im \Sigma \overset{\circ}{F}_j$$

The phase term of the sum is the estimated phase error term $[e^{i\phi}]^{\hat{}}$. The phase error term $[e^{i\phi}]^{\hat{}}$ is obtained as shown in step 46 of the flowchart of FIG. 3 where:

$$[e^{i\phi}]^{\hat{}} = (A + iB) \div (A^2 + B^2)^{\frac{1}{2}}.$$

The observed values are then modified as a function of the estimated phase error term to obtain an estimate $\hat{F}_j$ of the central section data values having a substantially reduced phase error as follows:

$$\hat{F}_j = \overset{\circ}{F}_j [e^{-i\phi}]^{\hat{}}.$$

where the phase error correction term, $[e^{-i\phi}]^{\hat{}}$, is defined as the reciprocal of $[e^{i\phi}]^{\hat{}}$.

In the alternative, the step of calculating the estimated phase error of the sum of the observed values may comprise the substep of calculating the estimated phase error angle $\hat{\phi}$ of the sum of the data values as follows:

$$\hat{\phi} = \tan^{-1} (B \div A).$$

In this case, the estimated phase error term takes the form $e^{i\hat{\phi}}$, and the estimate $\hat{F}_j$ of the central section data values having a substantially reduced phase error is calculated as follows:

$$\hat{F}_j = \overset{\circ}{F}_j [e^{-i\hat{\phi}}],$$

where $e^{-i\hat{\phi}}$ is the reciprocal of $e^{i\hat{\phi}}$.

Figure 6:
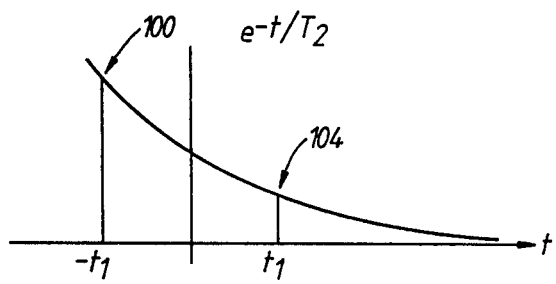
FIG. 6 is a plot of signal decay as a result of the $T_2$ effect as a function of time.

Both of the above described methods of the first preferred embodiment assumes the observed values are collected quickly enough to avoid any meaningful adverse effect from the $T_2$ decay; however, if RF echo data are, for example, collected from hydrogen nuclei over a time period of greater than 1 msec., the data are weakly dependent on $T_2$. The term "weakly dependent" means that the measured data can be modelled as:

$$\overset{\circ}{F}(X,0) \Big|_{X = \alpha t + \beta} = e^{i\phi} \times e^{-t/T_2} \times F(\alpha t + \beta, 0) \quad (16)$$

or if written as a function of X, $$\overset{\circ}{F}(X,0) = e^{i\phi} \times e^{-(X-\beta)/\alpha T_2} \times F(X,0) \quad (17)$$

where it has been assumed that there is some gross overall exponential decay such as shown in FIG. 6 which can be represented by the $T_2$ decay term, and $\phi$ represents the phase error angle which is to be estimated. Looking to FIG. 6, the $T_2$ decay effect causes the RF echo signal to decay exponentially with time, hence the data magnitudes decrease with increasing X.

The second preferred embodiment compensates for the $T_2$ decay effect. Specifically, if the decay is of the form $e^{-t/T_2}$ as shown in FIG. 6, then multiplying pairs of observed values symmetrically located about the Fourier space origin, i.e., symmetric about the Y axis as shown by value $-t_1$ at 100 and value $t_1$ at 104 in FIG. 6, cancels the decay effect, since:

$$e^{-t/T2} \times e^{-(-t)/T2} = 1.$$

Figure 5:
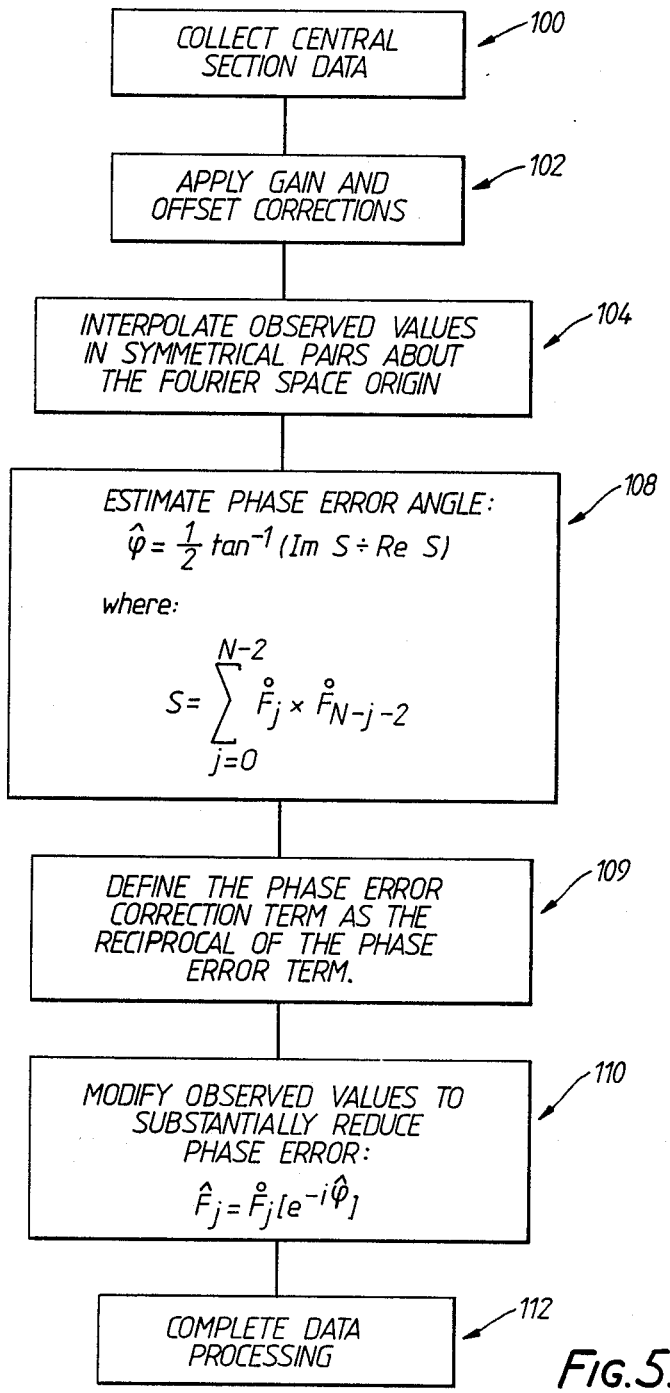
FIG. 5 is a flow diagram of the functions performed by the MRI apparatus of FIG. 2 to calculate a phase error according to a second preferred embodiment of the invention.

As shown in the flow chart of FIG. 5, data values including uncorrected observed values are collected along a central section scan line and corrected for gain and offset in a normal manner, steps 100 and 102; the corrected observed values, also called observed values, are further interpolated to form pairs of data values with one member of each pair located symmetrically, one on either side of the origin of Fourier space, step 104; the phase error angle of the observed values is estimated by calculating the phase angle of the sum S of the product of each of the pairs, step 108; the estimated phase error correction term is defined as the reciprocal of the estimated phase error term, 109; the observed values are modified as a function of the estimated phase error angle to substantially reduce phase error, step 110; and the modified observed values are used for other processing purposes such as correcting data values for other scan lines or otherwise contributing to production of a visual display, step 112.

Steps 100 and 102 of FIG. 5 are essentially identical to steps 40 and 42, respectively, of FIG. 3. Observed value relocation, step 104, and estimation of the phase error angle, step 108, differ from the steps of FIG. 3 in order to compensate for observed values which are weakly dependent on $T_2$ as discussed above.

Since F is the transform of a real function and is therefore Hermitian, $$F(X,0) \times F(-X,0) = e^{2i\phi} \times e^{2\beta/\alpha T2} \times F(X,0) \times \overline{F}(X,0) \quad (18)$$

where $\overline{F}$ is the complex conjugate of F. By applying Rayleigh's Theorem to the first definition of P in equation (6):

$$\int F(X,0) \times F(-X,0) \, dX = e^{2i\phi} \times e^{2\beta/\alpha T2} \times \int |F(X,0)|^2 \, dX \quad (19)$$

$$= e^{2i\phi} \times e^{2\beta/\alpha T2} \times \int |P(x,0)|^2 \, dx. \quad (20)$$

By the definition of P in equation (7), $$P(x,0) = \int f(x,y) \, dy \quad (21)$$

and since f is real, P(x,0) is real and $\int |P(x,0)|^2 \, dx$ is real. Since $e^{2\beta/\alpha T2}$ is real it follows that the phase of:

$$\int F(X,0) \times F(-X,0) \, dX \quad (22)$$

is $e^{2i\phi}$ and in principle, the phase error term $e^{i\phi}$ can be calculated. However, the practical process of calculating this integral from the discretely sampled observed values places constraints on the position of the sample values.

The integral of equation (22) may be approximated by a sum of the form $$\sum_{j=0}^{N-1} \overset{\circ}{F}(X_j, 0) \times \overset{\circ}{F}(-X_j, 0) \Delta X, \quad (23)$$

but since this must be calculated from a single equi-spaced sampling covering both the positive and negative values of X, this implies that if $X_j$ is one of the sample values, then so is $-X_j$. The are only two cases for which this is true: (1) where the echo peak (at X=0) lies on a sample value, and (2) where the echo peak lies halfway between two sample values. The first case is developed in detail and the result is quoted for the second case.

CASE 1

Suppose the origin (X=0) lies on a sampled data value. Typically there are an even number of observed values. It is therefore assumed that X=0 corresponds to the value N/2−1, where N is the number of values. For example, if N=1024 and j takes integer values between 0 and 1023, inclusive, then the peak is at value 511. Generally, if j=0, 1, ..., N−1 and:

$$X_j = \alpha j \Delta t + \beta.$$

then $$0 = X_{N/2-1} = \alpha \Delta t (N/2 - 1) + \beta$$

and $$\beta = -\alpha \Delta t (N/2 - 1)$$

hence $$X_j = \alpha \Delta t [j - (N/2 - 1)].$$

Thus $$-X_j = -\alpha \Delta t [j - (N/2 - 1)]$$

$$= \alpha \Delta t [(N - j - 2) - (N/2 - 1)]$$

$$= X_{N-j-2}$$

and the integral of equation (22) can therefore be approximated by:

$$\int \overset{\circ}{F}(X,0) \times \overset{\circ}{F}(-X,0) \, dX \simeq \sum_{j=0}^{N-2} \overset{\circ}{F}(X_j, 0) \times \overset{\circ}{F}(-X_j, 0) \Delta X \quad (24)$$

$$\simeq \sum_{j=0}^{N-2} \overset{\circ}{F}(X_j, 0) \times \overset{\circ}{F}(X_{N-j-2}, 0) \Delta X \quad (25)$$

$$\simeq \sum_{j=0}^{N-2} \overset{\circ}{F}_j \times \overset{\circ}{F}_{N-j-2} \Delta X. \quad (26)$$

The upper limit of the summation is N−2 since the value $X_{N-1}$ would be paired with the value $X_{-1}$ for which F has not been measured.

As shown in step 108 of the flowchart of FIG. 5, the phase error can therefore be estimated by computing the phase of equation (26), as shown in equation (27) below:

$$\hat{\phi} = \tfrac{1}{2} \tan^{-1}(Im \, S \div Re \, S), \quad (27)$$

The term S is the value of the sum calculated in equation (26). In practice, it is not necessary to multiply each term in equation (26) by $\Delta X$ because $\Delta X$ cancels out when the sum S is used in equation (27). Step 108 of the flowchart of FIG. 5 therefore shows S as being calculated without $\Delta X$ to save computer time. Equation (27) is equivalent to combining equations (26) and (27):

$$\hat{\phi} = \tfrac{1}{2} \tan^{-1}\left[ \frac{Im\ \Sigma\ \mathring{F}_j\ \mathring{F}_{N-j-2}}{Re\ \Sigma\ \mathring{F}_j\ \mathring{F}_{N-j-2}} \right] \quad (28)$$

In practice it is possible to ensure that the peak value of the echo occurs around the middle of the data set (i.e., around N/2) but it is not possible to ensure that $\beta$ has a specific value such as:

$$\beta = -\Delta t(N/2 - 1).$$

If the above formulae are to be used to calculate $\phi$ when $T_2$ effects are present, first it is necessary to perform the interpolation of the observed values so that the origin (X=0) corresponds to an interpolated data point, step 104 of FIG. 5, to put the echo peak at $X_{N/2-1}$.

In accordance with the invention an estimated phase error angle $\hat{\phi}$ is then obtained by calculating the phase of the sum S of the product of each of the observed values located on the central section scan line on one side of the origin with a corresponding one of the observed values symmetrically located on the scan line on the other side of the origin. The estimate of the phase error angle, $\hat{\phi}$, may be obtained by calculating the phase of the sum S according to equations (27) or (28).

The observed values can then be modified as a function of the estimated phase error angle $\hat{\phi}$ to obtain an estimate $\hat{F}_j$ of the central section data values having a substantially reduced phase error, step 110:

$$\hat{F}_j = \mathring{F}_j[e^{-i\hat{\phi}}],$$

where $e^{-i\hat{\phi}}$ is the reciprocal of $e^{i\hat{\phi}}$.

CASE 2

Where the origin (X=0) lies halfway between sample values $N/2-1$ and $N/2$, $$X_j = \alpha \Delta t[j - (N-1)/2],$$

$$-X_j = X_{N-j-1},$$

and $$\int \mathring{F}(X,0) \times \mathring{F}(-X,0)\ dX \approx \sum_{J=0}^{N-1} \mathring{F}_j \times \mathring{F}_{N-j-1}\ \Delta X \quad (29)$$

$$\hat{\phi} = \tfrac{1}{2} \tan^{-1}\left[ \frac{Im\ \Sigma\ \mathring{F}_j\ \mathring{F}_{N-j-1}}{Re\ \Sigma\ \mathring{F}_j\ \mathring{F}_{N-j-1}} \right]. \quad (30)$$

As before, the observed values can then be modified as a function of the estimated phase error angle $\hat{\phi}$ to obtain an estimate $\hat{F}_j$ of the central section data values having a substantially reduced phase error, step 110:

$$\hat{F}_j = \mathring{F}_j[e^{-i\hat{\phi}}],$$

where $e^{-i\hat{\phi}}$ is the reciprocal of $e^{i\hat{\phi}}$.

Thus, the phase error angle $\hat{\phi}$ can be obtained either when an observed value lies directly on the origin and the remaining observed values lie in pairs symmetrically located one on either side of the origin (case 1 and equation 28), or when no observed value lies directly on the origin, but the remaining observed values still lie in pairs symmetrically located one on either side of the origin (case 2 and equation 30). The function of step 104 of FIG. 5 is to locate the obtained observed values in the symmetrical pairs required by either equation (28) or equation (30).

Additional advantages and modifications will readily occur to those skilled in the art. The invention in its broader aspects is not, therefore, limited to the specific details, representative methods, and illustrative examples shown and described. Accordingly, departures may be made from such details without departing from the spirit or scope of applicant's general inventive concept.

What is claimed is:

1. A method for correcting for a phase error in observed values of central section magnetic resonance imaging data obtained from an object under observation comprising the steps of:
    (a) subjecting the object to magnetic field gradients and radio frequency pulses to produce from the object a plurality of observed values, $\mathring{F}_j$, of the central section data values representing a central section scan line in a Fourier space defined by said magnetic field gradients;
    (b) estimating the phase error of said observed values by calculating the phase of the sum of said observed values; and
    (c) modifying said observed values as a function of said estimated phase error to obtain an estimate $\hat{F}_j$ of said central section data values having a substantially reduced phase error.

2. The method of claim 1 wherein said step of estimating includes estimating a phase error angle $\hat{\phi}$ of said observed values by calculating the phase angle of the sum of said observed values.

3. The method of claims 1 or 2 wherein said step of estimating includes estimating a phase error term of said observed values by calculating the phase term of the sum of said observed values.

4. The method of claim 3 wherein said step of estimating includes:
    (a) determining the sum A of the real components of said observed values Re $\mathring{F}_j$ such that $$A = Re\ \Sigma \mathring{F}_j;\ \text{and}$$

(b) determining the sum B of the imaginary components of said observed values Im $\mathring{F}_j$ such that $$B = Im\ \Sigma \mathring{F}_j.$$

5. The method of claim 4 wherein said estimated phase error term is represented by $[e^{i\hat{\phi}}]$, and wherein said step of estimating includes calculating the estimated phase error angle $\hat{\phi}$ from the phase of the sum of said observed values with the following equation:

$$\hat{\phi} = \tan^{-1}(B \div A).$$

6. The method of claim 4 wherein said estimated phase error term is represented by $[e^{i\hat{\phi}}]$, and where said step of estimating includes calculating said estimated phase error correction term $[-i\hat{\phi}]$ in accordance with the following equation:

$$[e^{i\hat{\phi}}] = (A + iB) \div (A^2 + B^2)^{\tfrac{1}{2}},$$

where $i = (-1)^{\tfrac{1}{2}}$ and where $[e^{-i\hat{\phi}}]$ is defined as the reciprocal of $[e^{i\hat{\phi}}]$.

7. The method of claim 5 wherein said step of modifying includes multiplying said observed values, $\mathring{F}_j$, by an estimated phase error correction term $e^{-i\hat{\phi}}$, where $e^{-i\hat{\phi}}$ is the reciprocal of $e^{i\hat{\phi}}$, to obtain said estimate $\hat{F}_j$ of said central section data values having a substantially reduced phase error.

8. The method of claim 6 wherein said step of modifying includes multiplying said observed values, $\overset{\circ}{F}_j$, by an estimated phase error correction term $[e^{-i\hat{\phi}}]\hat{\,}$, where $[e^{-i\hat{\phi}}]\hat{\,}$ is defined as the reciprocal of $[e^{i\hat{\phi}}]\hat{\,}$, to obtain said estimate $\hat{F}_j$ of said central section data values having a substantially reduced phase error.

9. The method of claim 6 wherein said step of modifying includes dividing said observed values, $\overset{\circ}{F}_j$, by an estimated phase error term $[e^{i\hat{\phi}}]\hat{\,}$ to obtain said estimate $\hat{F}_j$ of said central section data values having a substantially reduced phase error.

10. A method for correcting for a phase error in central section magnetic resonance imaging data obtained from an object under observation comprising the steps of:
  (a) subjecting the object to magnetic field gradients and radio frequency pulses to produce from the object a plurality of observed values, $\overset{\circ}{F}_j$, of the central section data values representing a central section scan line in a Fourier space defined by said magnetic field gradients;
  (b) performing an interpolation of said observed values to situate said observed values in pairs symmetrically located one on either side of the origin of said Fourier space;
  (c) estimating the phase error of said observed values by calculating the phase of the sum S of the product of each of said pairs of observed values; and
  (d) modifying said observed values as a function of said estimated phase error to obtain an estimate $\hat{F}_j$ of said central section data values having a substantially reduced phase error.

11. The method of claim 10 wherein said step of estimating includes calculating the estimated phase error angle $\hat{\phi}$ by calculating the phase angle of said sum S.

12. The method of claim 10 wherein said step of estimating includes calculating said estimated phase error angle $\hat{\phi}$ in accordance with the following equation:

$$\hat{\phi} = \tfrac{1}{2}\tan^{-1}(Im\, S \div Re\, S),$$

where Im S is the imaginary component of said sum S and Re S is the real component of said sum S.

13. The method of claims 11 or 12 wherein said step of modifying includes multiplying said observed values, $\overset{\circ}{F}_j$, by an estimated phase error correction term $[e^{-i\hat{\phi}}]$ to obtain said estimate $\hat{F}_j$ of said central section data values having a substantially reduced phase error.

14. An apparatus for correcting for a phase error $\phi$ in central section magnetic resonance imaging data values obtained from an object under observation comprising:
  (a) means for subjecting the object to magnetic field gradients and radio frequency pulses to produce from the object a plurality of observed values, $\overset{\circ}{F}_j$, of the central section data values representing a central section scan line in a Fourier space defined by said magnetic field gradients;
  (b) means for estimating the phase error of the observed values by calculating the phase of the sum of said observed values; and
  (c) means for modifying said observed values as a function of said estimated phase error to obtain an estimate $\hat{F}_j$ of said central section data values having a substantially reduced phase error.

15. The apparatus of claim 14 wherein said means for estimating includes means for estimating a phase error angle $\hat{\phi}$ of said observed values by calculating the phase angle of the sum of said observed values.

16. The apparatus of claims 14 or 15 wherein said means for estimating includes means for estimating a phase error term of said observed values by calculating the phase term of the sum of said observed values.

17. The apparatus of claim 16 wherein said means for estimating includes:
  (a) means for determining the sum A of the real components of said observed values Re $\overset{\circ}{F}_j$ such that $$A = \Sigma Re\, \overset{\circ}{F}_j;$$

and
  (b) means for determining the sum B of the imaginary components of said observed values Im $\overset{\circ}{F}_j$ such that $$B = \Sigma Im\, \overset{\circ}{F}_j.$$

18. The apparatus of claim 17 wherein said estimated phase error term is represented by $e^{i\hat{\phi}}$, and wherein said means for estimating includes calculating the estimated phase error angle $\hat{\phi}$ from the phase of the sum of said observed values with the following equation:

$$\hat{\phi} = \tan^{-1}(B \div A).$$

19. The apparatus of claim 17 wherein said estimated phase error term is represented by $[e^{i\hat{\phi}}]\hat{\,}$, and where said means for estimating includes means for calculating said estimated phase error correction term $[e^{-i\hat{\phi}}]\hat{\,}$ in accordance with the following equation:

$$[e^{i\hat{\phi}}]\hat{\,} = (A + iB) \div (A^2 + B^2)^{\frac{1}{2}},$$

where $i = (-1)^{\frac{1}{2}}$ and $[e^{-i\hat{\phi}}]\hat{\,}$ is defined as the reciprocal of $[e^{i\hat{\phi}}]\hat{\,}$.

20. The apparatus of claim 18 wherein said means for modifying includes means for multiplying said observed values $\overset{\circ}{F}_j$ by an estimated phase error correction term $e^{-i\hat{\phi}}$, where $e^{-i\hat{\phi}}$ is defined as the reciprocal of $e^{i\hat{\phi}}$, to obtain said estimate $\hat{F}_j$ of said central section data values having a substantially reduced phase error.

21. The apparatus of claim 19 wherein said means for modifying includes means for multiplying said observed values, $\overset{\circ}{F}_j$, by an estimated phase error correction term $[e^{-i\hat{\phi}}]\hat{\,}$, where $[e^{-i\hat{\phi}}]\hat{\,}$ is defined as the reciprocal of $[e^{i\hat{\phi}}]\hat{\,}$, to obtain said estimate $\hat{F}_j$ of said central section data values having a substantially reduced phase error.

22. The apparatus of claim 19 wherein said means for modifying includes means for dividing said observed values, $\overset{\circ}{F}_j$, by an estimated phase error term $[e^{i\hat{\phi}}]\hat{\,}$ to obtain said estimate $\hat{F}_j$ of said central section data values having a substantially reduced phase error.

23. An apparatus for correcting for a phase error in central section magnetic resonance imaging data obtained from an object under observation comprising:
  (a) means for subjecting the object to magnetic field gradients and radio frequency pulses to produce from the object a plurality of observed values, $\overset{\circ}{F}_j$, of the central section data values representing a central section scan line in a Fourier space defined by said magnetic field gradients;
  (b) means for performing a zero location and correction of said observed values to situate said data values in pairs symmetrically located one on either side of the origin of said Fourier space;

(c) means for estimating the phase error of said observed values by calculating the phase of the sum S of the product of each of said pairs of observed values; and (d) means for modifying said observed values as a function of said estimated phase error to obtain an estimate $\hat{F}_j$ of said central section data values having a substantially reduced phase error.

24. The apparatus of claim 23 wherein said means for estimating includes means for calculating the estimated phase error angle $\hat{\phi}$ by calculating the phase angle of said sum S.

25. The apparatus of claim 24 wherein said means for estimating includes means for calculating said estimated phase error angle $\hat{\phi}$ in accordance with the following equation:

$$\hat{\phi} = \tfrac{1}{2} \tan^{-1}(Im\ S \div Re\ S),$$

where Im S is the imaginary component of said sum S and Re S is the real component of said sum S.

26. The apparatus of claims 24 or 25 wherein said means for modifying includes means for multiplying said observed values, $\tilde{F}_j$, by an estimated phase error correction term $[e^{-i\hat{\phi}}]$ to obtain said estimate $\hat{F}_j$ of said central section data values having a substantially reduced phase error.

* * * * *